United States Patent
Grass et al.

(10) Patent No.: US 9,484,245 B2
(45) Date of Patent: Nov. 1, 2016

(54) METHODS FOR FABRICATING INTEGRATED CIRCUITS WITH ISOLATION REGIONS HAVING UNIFORM STEP HEIGHTS

(71) Applicant: GLOBALFOUNDRIES, Inc., Grand Cayman (KY)

(72) Inventors: Carsten Grass, Dresden (DE); Martin Trentzsch, Radebeul (DE); Sören Jansen, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 108 days.

(21) Appl. No.: 14/527,424

(22) Filed: Oct. 29, 2014

(65) Prior Publication Data

US 2016/0126132 A1    May 5, 2016

(51) Int. Cl.
*H01L 21/762* (2006.01)
*H01L 21/266* (2006.01)
*H01L 21/311* (2006.01)

(52) U.S. Cl.
CPC ....... *H01L 21/76237* (2013.01); *H01L 21/266* (2013.01); *H01L 21/31111* (2013.01); *H01L 21/31144* (2013.01)

(58) Field of Classification Search
CPC ........... H01L 21/76237; H01L 21/266; H01L 21/31144; H01L 21/31111

USPC ........................................................ 438/424
See application file for complete search history.

(56) References Cited

U.S. PATENT DOCUMENTS

| | | | | |
|---|---|---|---|---|
| 7,282,402 B2* | 10/2007 | Sadaka | ............... | H01L 29/1054 257/E21.63 |
| 2002/0052075 A1* | 5/2002 | Noda | ............. | H01L 21/823807 438/224 |
| 2011/0269277 A1* | 11/2011 | Kronholz | ............ | H01L 21/3083 438/218 |

* cited by examiner

*Primary Examiner* — William F Kraig
*Assistant Examiner* — Pavel Ivanov
(74) *Attorney, Agent, or Firm* — Lorenz & Kopf, LLP

(57) ABSTRACT

Methods for fabricating integrated circuits are provided. In an embodiment, a method for fabricating an integrated circuit includes providing a semiconductor substrate including an isolation region between a first device region and a second device region. The isolation region includes a first portion adjacent the first device region and a second portion adjacent the second device region. The method includes selectively etching the second portion of the isolation region to a second height. The method forms an insulation layer over the first device region and second device region. The method further includes selectively etching the insulation layer over the first device region and the first portion of the isolation region. The first portion of the isolation region is etched to a first height substantially equal to the second height.

20 Claims, 4 Drawing Sheets

METHODS FOR FABRICATING INTEGRATED CIRCUITS WITH ISOLATION REGIONS HAVING UNIFORM STEP HEIGHTS

TECHNICAL FIELD

The present disclosure generally relates to methods for fabricating integrated circuits, and more particularly relates to methods for fabricating integrated circuits with isolation regions having uniform step heights.

BACKGROUND

As miniaturization of elements of integrated circuits drives the semiconductor fabrication industry, critical dimensions of elements must be minimized. Further, vertical variation of elements, or "topography", must be minimized in order to increase lithography and etch process windows and, ultimately, the yield of integrated circuits.

Conventional shallow trench isolation (STI) fabrication techniques include forming a planarization stop layer, e.g., silicon nitride, on an upper surface of a semiconductor substrate, etching the planarization stop layer and semiconductor substrate to form a trench in the semiconductor substrate, forming a thermal oxide liner in the trench, and overfilling the trench with isolation material, such as silicon oxide, to form an overburden on the nitride planarization stop layer. Planarization is then implemented, such as by conducting chemical mechanical polishing (CMP). During subsequent processing, the planarization stop layer is removed followed by formation of active areas for semiconductor devices, which typically involve masking, ion implantation, and cleaning steps.

Different types of semiconductor devices formed in an integrated circuit may require different heights of underlying insulator material, such as oxide. For example, in forming field-effect transistor (FET) devices, an insulator is present between a gate electrode and a semiconductor substrate. Different types of FET devices are functionally optimized with different thicknesses of gate insulator that must be formed on a semiconductor substrate during processing. The thickness of the gate insulation, also referred to as the gate oxide, affects several properties of the resulting transistor. As such, FET devices having several different gate thicknesses are increasingly required for modern semiconductor devices. For example, various FET devices such as thin gate oxide FET devices, medium thick gate oxide FET devices, and thick gate oxide FET devices all require different gate oxide thickness for optimal performance.

Masking, photolithography patterning, and etching processes are employed to form each insulation thickness that is required for each type of FET device to be formed. STI regions that are located between devices requiring different insulation thicknesses may be unevenly etched during such processing. As a result, such STI regions are formed with uneven heights (or "step heights").

Accordingly, it is desirable to provide methods for fabricating integrated circuits with isolation regions having uniform step heights. In addition, it is desirable to provide methods for fabricating integrated circuits with isolation regions having uniform step heights that require no additional masking steps. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In an embodiment, a method for fabricating an integrated circuit includes providing a semiconductor substrate including an isolation region between a first device region and a second device region. The isolation region includes a first portion adjacent the first device region and a second portion adjacent the second device region. The method includes selectively etching the second portion of the isolation region to a second height. The method forms an insulation layer over the first device region and second device region. The method further includes selectively etching the insulation layer over the first device region and the first portion of the isolation region. The first portion of the isolation region is etched to a first height substantially equal to the second height.

In another embodiment, a method for fabricating an integrated circuit provides a semiconductor substrate including an isolation region between a first device region and a second device region. The isolation region includes a first portion adjacent the first device region and a second portion adjacent the second device region. The method includes performing a first doping process on the first device region and performing a second doping process on the second device region. The method etches the second portion of the isolation region to lower the second portion of the isolation region to a second height. The method includes forming an insulation layer over the first device region and second device region. The method further includes performing an etch process to remove the insulation layer over the first device region and to lower the first portion of the isolation region to a first height substantially equal to the second height.

In accordance with another embodiment, a method for fabricating an integrated circuit includes forming an isolation region between a first device region and a second device region in a semiconductor substrate. The method forms a sacrificial layer over the first device region and the second device region. The method includes masking the second device region with a second mask, performing a first implantation process on the first device region, and removing the second mask. The method further includes masking the first device region with a first mask, performing a second implantation process on the second device region, etching the sacrificial layer over the second device region, and removing the first mask. The method further includes forming an insulation layer over the first device region and the second device region, masking the second device region, and etching the insulation layer from the first device region.

BRIEF DESCRIPTION OF THE DRAWINGS

Embodiments of the methods for fabricating an integrated circuit will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed. Furthermore, there is no intention to be bound by any expressed or implied theory presented in the preceding technical field, background or brief summary, or in the following detailed description.

It is contemplated herein that vertical variation can be reduced or eliminated for an isolation region located between a first device region having a thin insulation layer and a second device region having a thick insulation layer. In an exemplary method, the portion of the isolation region adjacent the second device region is etched before an insulation layer is formed on the first and second device regions. After the insulation is formed over the first and second device regions, the etched portion of the isolation region and the second device region are masked and the insulation layer over the first device region is removed. During removal of the insulation layer from the first device region, the portion of the isolation region adjacent the first device region is etched to substantially the same height as the portion of the isolation region adjacent the second device region.

In an exemplary embodiment, the portion of the isolation region adjacent the second device region is etched while a doping mask covers the first device region and adjacent portion of the isolation region. Thus, no additional mask is needed to provide the isolation region with reduced vertical variation.

In accordance with the various embodiments herein, a method for fabricating an integrated circuit results in reduced vertical variation in isolation region. FIGS. 1-11 illustrate, in cross section, an integrated circuit and method steps for fabricating such an integrated circuit in accordance with various embodiments herein. Various steps in the fabrication of integrated circuits are well known and so, in the interest of brevity, many conventional steps will only be mentioned briefly herein or will be omitted entirely without providing the well known process details.

Figure 1:
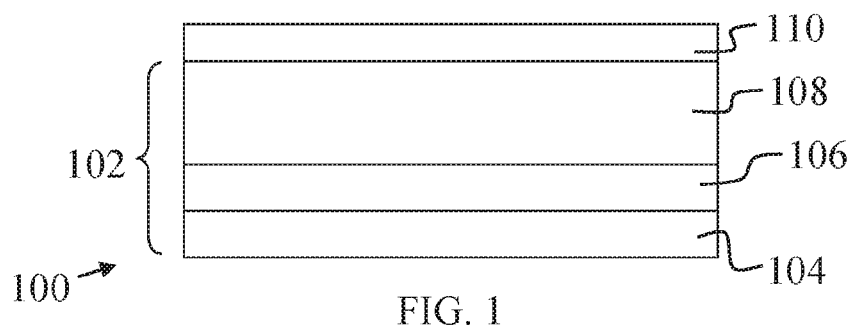
FIGS. 1-11 illustrate, in cross section, method steps for fabricating an integrated circuit in accordance with various embodiments herein.

Turning now to FIG. 1, in an exemplary embodiment, the process of fabricating an integrated circuit 100 includes providing a semiconductor substrate 102. The semiconductor substrate 102 may be a semiconductor on insulator (SOI) wafer as shown, or a bulk semiconductor wafer. The semiconductor substrate 102 can utilize any appropriate semiconductor material, such as silicon, germanium, gallium arsenide, and the like. The exemplary SOI type semiconductor substrate 102 includes a base layer 104 and an insulator layer 106 overlying the base layer 104. An exemplary insulator layer 106 is silicon oxide and may be referred to as "buried oxide". The semiconductor substrate 102 further includes a semiconductor material layer 108 overlying a silicon oxide layer 106. While the semiconductor substrate 102 may include any suitable semiconductor material, an exemplary embodiment employs silicon material, such as the relatively pure silicon materials typically used in the semiconductor industry as well as silicon admixed with other elements.

As shown in FIG. 1, a planarization stop layer 110 is deposited on the semiconductor substrate 102. In an exemplary embodiment, the planarization stop layer 110 is a silicon nitride layer, though the planarization stop layer 110 may be formed from any etchable material that can serve as a planarization stop. In an exemplary embodiment, the planarization stop layer 110 is deposited by chemical vapor deposition (CVD). Typically, there is also a thin silicon oxide layer (pad) below the planarization stop layer 110 that is not shown herein for purposes of simplicity and clarity.

Figure 2:
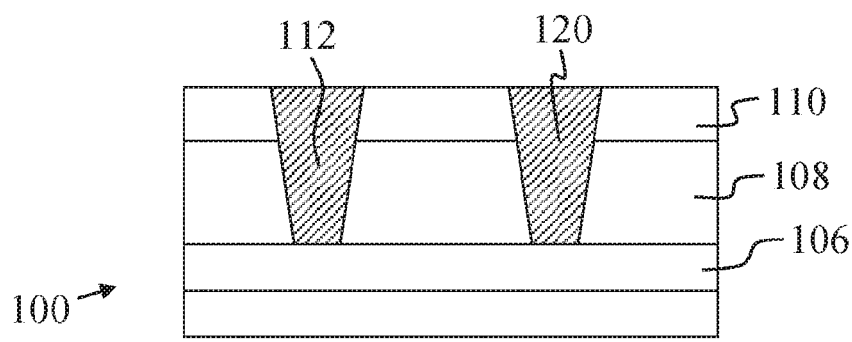

In FIG. 2, a masking material, such as photoresist, has been patterned over the planarization stop layer 110 in accordance with well known active area lithography processes. Then, the planarization stop layer 110 and semiconductor substrate 108 are etched to form trenches 112. The masking material is removed, such as through a resist strip process, and an isolation material is deposited in the trenches 112 and overlying the planarization stop layer 110. An exemplary isolation material is an oxide, such as silicon dioxide or other field oxide, applied by a spin-coating process. In FIG. 2, the isolation material is planarized to form isolation regions 120. Specifically, the isolation material is polished until the upper surface of the isolation material is substantially coplanar with the upper surface of the planarization stop layer 110. An exemplary process is chemical-mechanical planarization (CMP) using an abrasive and corrosive chemical slurry.

Figure 3:
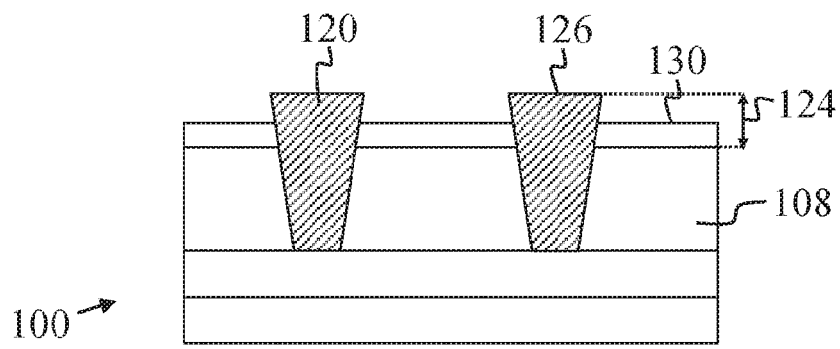

In FIG. 3, the planarization stop layer 110 is removed. As shown, each isolation region 120 is formed with a step height, indicated by double-headed arrow 124, above the semiconductor material layer 108. Specifically, the upper surface 126 is located at a step height 124 or distance above the semiconductor material layer 108. As further shown in FIG. 3, a sacrificial insulator layer 130 is formed on the semiconductor material layer 108. An exemplary sacrificial insulator layer 130 is silicon oxide. In an exemplary embodiment, the sacrificial insulator layer 130 is formed on the semiconductor material layer 108 by chemical vapor deposition (CVD) or another suitable method.

Figure 4:
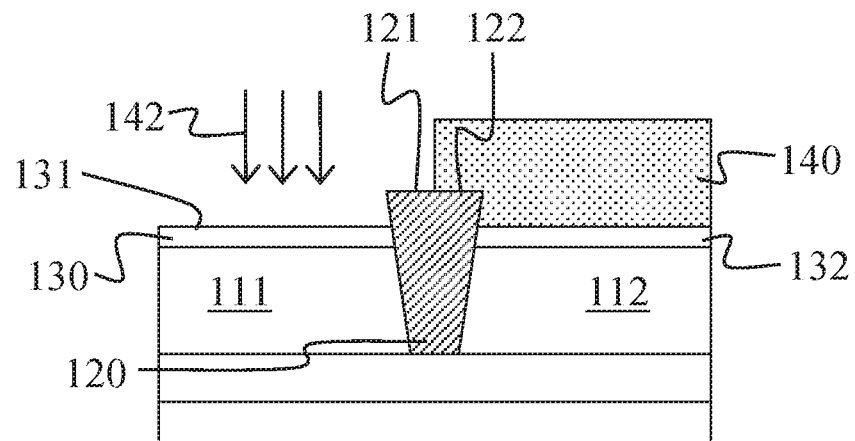

As shown in FIG. 4, an exemplary isolation region 120 is formed between a first device region 111 and a second device region 112. Further, the exemplary isolation region 120 includes a first portion 121 adjacent the first device region 111 and a second portion 122 adjacent the second device region 112. The sacrificial insulation layer 130 includes a first portion 131 over the first device region 111 and a second portion 132 over the second device region 112.

Exemplary device regions 111 and 112 may be doped differently. Therefore, in FIG. 4, a mask 140, such as a photoresist mask, is formed over the second device region 112 in accordance with conventional lithography processing. As shown, the mask 140 also covers the second portion 122 of the isolation region 120. A doping process is then performed. For example, ions 142 may be implanted into the first device region 111.

Figure 5:
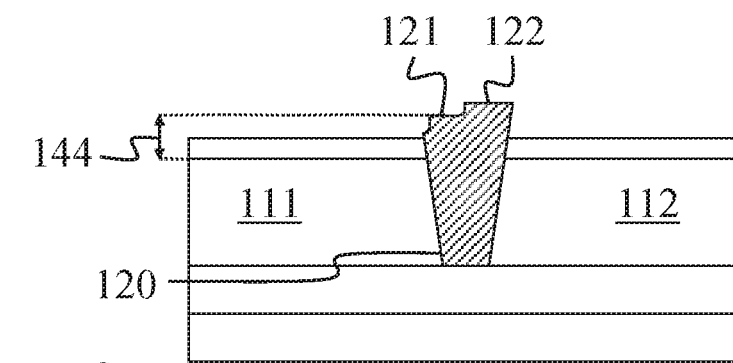

The mask 140 is removed in FIG. 5. An exemplary mask removal process includes a plasma strip process followed by a wet etch process. An exemplary wet etch process uses a dilute hydrofluoric acid etchant. As shown, the exemplary mask removal process etches the first portion 121 of the isolation region 120. As a result, the first portion 121 has a step height (indicated by double-headed arrow 144) less than step height 124.

Figure 6:
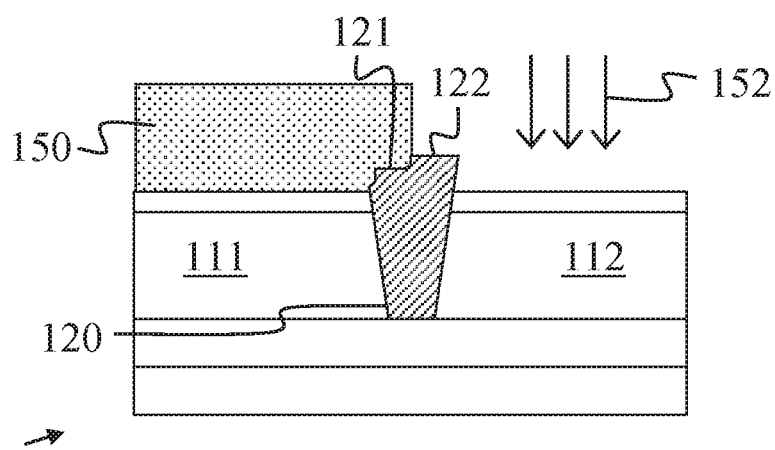

In FIG. 6, a mask 150, such as a photoresist mask, is formed over the first device region 111 in accordance with conventional lithography processing. As shown, the mask 150 also covers the portion 121 of the isolation region 120. Then, a doping process is performed. For example, ions 152 may be implanted into the second device region 112.

Figure 7:
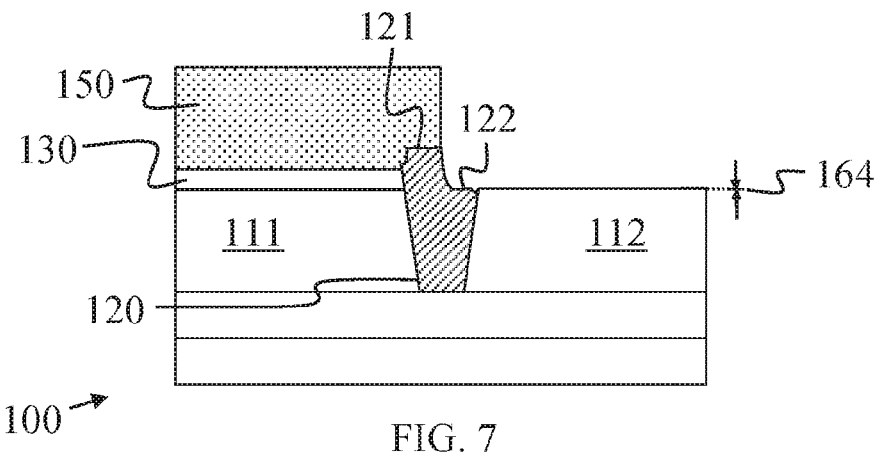

Before the mask 150 is removed, the second portion 122 of the isolation region 120 is etched in FIG. 7. As shown, the second portion 122 of the isolation region 120 is etched to a step height 164, indicated by arrows 164, over the semiconductor material layer 110. In an exemplary embodiment, step height 164 is zero. The step height 164 of the second portion 122 is less than the step height 144 of the first portion 121. In an exemplary embodiment, the second portion 122 of the isolation region 120 is etched with a wet etch, such as with dilute hydrofluoric acid. The etch process also removes the second portion 132 of the sacrificial insulation layer 130.

Figure 8:
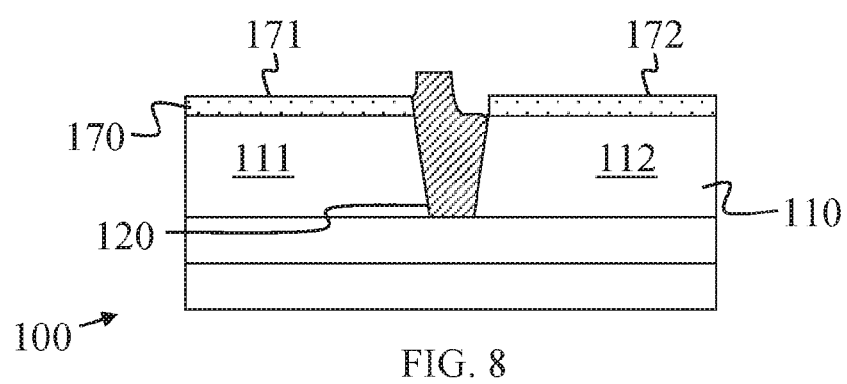

After etching the second portion 122 of the isolation region 120 while the mask 150 covers the first device region 111 and the first portion 121 of the isolation region, the mask 150 is removed, as shown in FIG. 8. An exemplary mask removal process includes a plasma strip process followed by a wet etch process. An exemplary wet etch process uses a dilute hydrofluoric acid etchant. The first portion 131 of the sacrificial insulation layer 130 is also removed. Then, a gate insulation layer 170, such as a gate oxide layer, is formed on the semiconductor material layer 110. In an exemplary embodiment, the gate insulator layer 170 is selectively formed, such as by thermal oxide growth. The gate insulator layer 170 includes a first portion 171 overlying the first device region 111 and a second portion 172 overlying the second device region 112.

Figure 9:
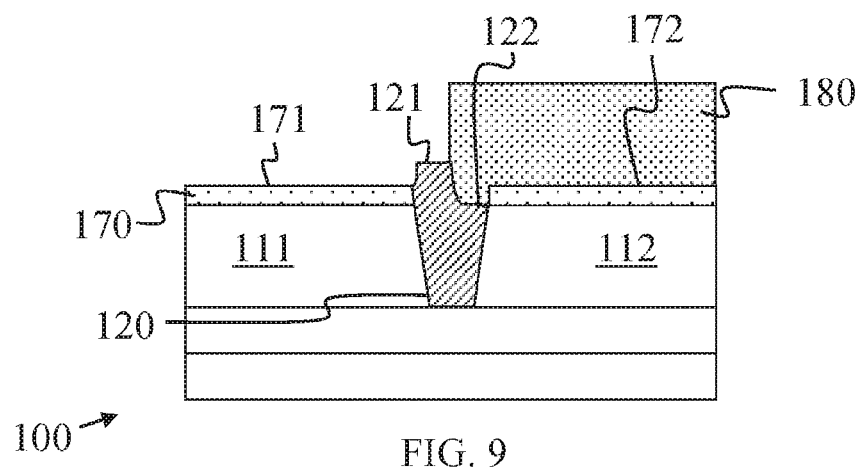

The gate insulation layer 170 is intended for use with semiconductor devices using thicker insulation layers. In the exemplary embodiment, the second device region 112 will include such a semiconductor device. Thus, first portion 171 of the gate insulation layer 170 is removed from the first device region 111. In FIG. 9, a mask 180, such as a photoresist mask, is formed over the second device region 112, according to conventional lithography processing. As shown, the mask 180 also covers the second portion 122 of the isolation region 120.

Figure 10:
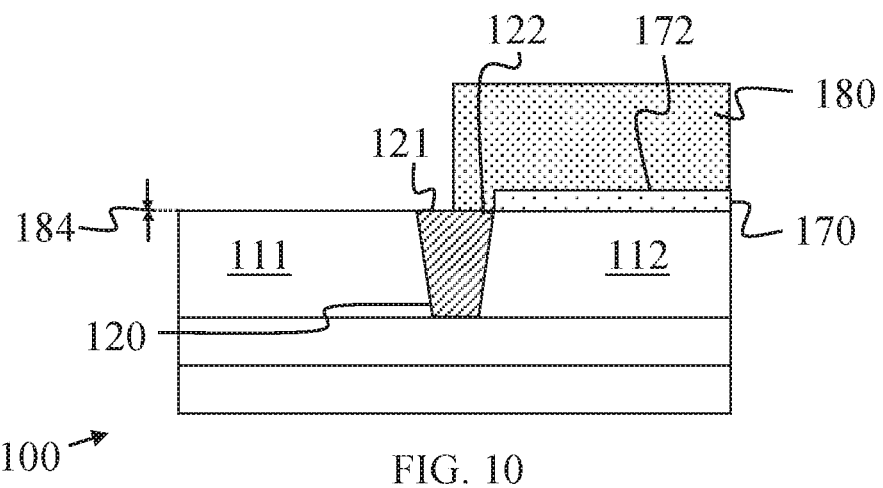

In FIG. 10, the insulation layer 170 is removed from the first device region 111. In an exemplary embodiment, a wet etch process, such as with dilute hydrofluoric acid, is performed to remove the insulation layer 170. The exemplary etch process removes the insulation layer 170 from the first device region 111 and etches the exposed first portion 121 of the isolation region 120. Specifically, the etch process etches the first portion 121 of the isolation region 120 to a step height, indicated by arrows 184, substantially equal to the step height 164. As a result, the isolation region 120 is provided with a substantially uniform step height and a substantially planar upper surface.

Figure 11:
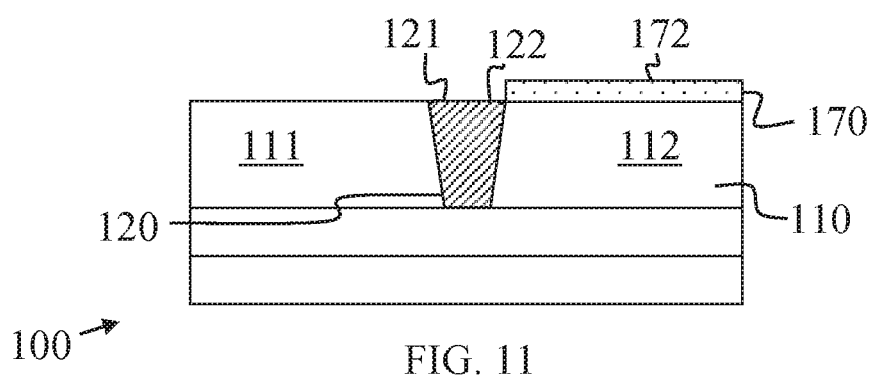

In FIG. 11, the mask 180 is removed, such as by a plasma strip and wet etch process. As a result, the partially fabricated integrated circuit 100 is formed with a difference in gate insulation thickness between the first device region 111 and the second device region 112, and with an isolation region 120 between the first and second device regions having a substantially uniform step height. In FIG. 11, the first device region 111 includes no gate insulation; however, further deposition of a layer or layers of insulation material over the device regions 111 and 112 provides for thin insulator device formation and thick insulator device formation.

Additional processing including forming additional insulation layers, forming gate structures and transistor structures and well known final process steps (e.g., back end of line (BEOL) process steps) may then be performed. It should be understood that various steps and structures may be utilized in further processing, and the subject matter described herein is not limited to any particular number, combination, or arrangement of steps or structures.

To briefly summarize, the fabrication methods described herein result in integrated circuits having isolation regions with planar surfaces and substantially uniform step height. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate including an isolation region between a first device region and a second device region, wherein the isolation region includes a first portion adjacent the first device region and a second portion adjacent the second device region;
   selectively etching the second portion of the isolation region to a second height;
   after selectively etching the second portion of the isolation region to the second height, forming an insulation layer including a first insulation layer portion over the first device region and a second insulation portion over the second device region; and
   selectively etching the first insulation layer portion and the first portion of the isolation region, wherein the first portion of the isolation region is etched to a first height substantially equal to the second height.

2. The method of claim 1 further comprising, before selectively etching the second portion of the isolation region:
   performing a first doping process on the first device region; and
   performing a second doping process on the second device region.

3. The method of claim 1 further comprising:
   masking the second device region with a second mask;
   performing a first implantation process on the first device region; and
   before selectively etching the second portion of the isolation region, performing an etch process to remove the second mask and to recess the first portion of the isolation region to a recessed height.

4. The method of claim 3 further comprising masking the second device region and the second portion of the isolation region with a third mask, and wherein the method further comprises removing the third mask after selectively etching the first insulation layer portion and the first portion of the isolation region.

5. The method of claim 3 further comprising masking the first device region with a first mask and performing a second implantation process on the second device region before selectively etching the second portion of the isolation region.

6. The method of claim 5 further comprising removing the first mask after selectively etching the second portion of the isolation region.

7. The method of claim 1 wherein:
   the semiconductor substrate has an upper surface;
   after selectively etching the second portion of the isolation region to the second height, the second portion of the isolation region has an upper surface substantially co-planar with the upper surface of the semiconductor substrate; and
   after selectively etching the first portion of the isolation to the first heigh, the first portion of the isolation region has an upper surface substantially co-planar with the upper surface of the semiconductor substrate.

8. The method of claim 7 wherein selectively etching the second portion of the isolation region comprises performing a first wet etch, and wherein selectively etching the first insulation layer portion and the first portion of the isolation region comprises performing a second wet etch.

9. The method of claim 7 wherein selectively etching the second portion of the isolation region comprises performing a first wet etch with dilute hydrofluoric acid, and wherein selectively etching the first insulation layer portion and the first portion of the isolation region comprises performing a second wet etch with dilute hydrofluoric acid.

10. The method of claim 1 wherein forming the insulation layer over the first device region and second device region comprises forming the insulation layer on the first device region and the second device region by a thermal oxide growth process.

11. The method of claim 1 wherein a sacrificial layer is provided over the first device region and the second device region, and wherein selectively etching the second portion of the isolation region comprises etching the sacrificial layer from the second device region.

12. A method for fabricating an integrated circuit, the method comprising:
    providing a semiconductor substrate including a first device region having a first upper substrate surface and a second device region having a second upper substrate surface;
    forming an isolation region in the semiconductor substrate between the first device region and the second device region, wherein the isolation region includes a first portion adjacent the first device region and a second portion adjacent the second device region;
    performing a first doping process on the first device region;
    performing a second doping process on the second device region;
    etching the second portion of the isolation region to lower the second portion of the isolation region to a second upper surface co-planar with the first upper substrate surface and the second upper substrate surface;
    forming an insulation layer over the first device region and second device region; and
    performing an etch process to remove the insulation layer over the first device region and to lower the first portion of the isolation region to a first upper surface co-planar with the first upper substrate surface and the second upper substrate surface.

13. The method of claim 12 wherein:
    performing the first doping process on the first device region comprises:
        masking the second device region with a second mask; and
        removing the second mask,
    performing the second doping process on the second device region comprises:
        masking the first device region with a first mask; and
        removing the first mask; and
    etching the second portion of the isolation region comprises etching the second portion of the isolation region before removing the first mask.

14. The method of claim 12 wherein a sacrificial layer is provided over the first device region and the second device region, and wherein etching the second portion of the isolation region comprises etching the sacrificial layer over the second device region.

15. The method of claim 12 wherein the method comprises forming the insulation layer over the first device region and second device region after etching the second portion of the isolation region to lower the second portion of the isolation region to the second upper surface.

16. The method of claim 12 wherein forming the insulation layer over the first device region and second device region comprises forming the insulation layer on the first device region and the second device region by a thermal oxide growth process.

17. The method of claim 12 further comprising:
    masking the second device region and the second portion of the isolation region with a third mask; and
    after performing the etch process to remove the insulation layer over the first device region and to lower the first portion of the isolation region to a first upper surface co-planar with the first upper substrate surface and the second upper substrate surface, removing the third mask.

18. A method for fabricating an integrated circuit, the method comprising:
    forming an isolation region between a first device region and a second device region in a semiconductor substrate;
    forming a sacrificial layer over the first device region and the second device region;
    masking the second device region with a second mask;
    performing a first implantation process on the first device region;
    removing the second mask;
    masking the first device region with a first mask;
    performing a second implantation process on the second device region;
    removing the sacrificial layer over the second device region;
    removing the first mask and the sacrificial layer over the first device region;
    after removing the sacrificial layer over the second device region and over the first device region, forming an insulation layer over the first device region and the second device region;
    masking the second device region; and
    etching the insulation layer from the first device region.

19. The method of claim 18 wherein:
    masking the second device region with the second mask comprises masking a second portion of the isolation region;
    removing the second mask comprises etching a first portion of the isolation region;
    masking the first device region with the first mask comprises masking the first portion of the isolation region;
    removing the sacrificial layer over the second device region comprises etching the second portion of the isolation region.

20. The method of claim 19 wherein the method comprises:
    masking the second device region with the second mask after forming the sacrificial layer over the first device region and the second device region;
    masking the first device region with the first mask after removing the second mask;
    removing the first mask and the sacrificial layer over the first device region after removing the sacrificial layer over the second device region; and masking the second device region after forming the insulation layer over the first device region and the second device region.

\* \* \* \* \*